United States Patent
Kuo et al.

(10) Patent No.: US 7,158,438 B2
(45) Date of Patent: Jan. 2, 2007

(54) NETWORK PACKET BUFFER ALLOCATION OPTIMIZATION IN MEMORY BANK SYSTEMS

(75) Inventors: Chen-Chi Kuo, Pleasanton, CA (US); Senthil Nathan Arunachalam, Sunnyvale, CA (US); Sridhar Lakshmanamurthy, Sunnyvale, CA (US); Uday Naik, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 11/092,010

(22) Filed: Mar. 29, 2005

(65) Prior Publication Data

US 2005/0169092 A1    Aug. 4, 2005

Related U.S. Application Data

(62) Division of application No. 10/338,429, filed on Jan. 8, 2003, now Pat. No. 6,906,980.

(51) Int. Cl.
*G11C 8/00*    (2006.01)

(52) U.S. Cl. .................. 365/230.03; 710/52; 710/56
(58) Field of Classification Search ........... 365/230.03; 710/52, 56
See application file for complete search history.

(56) References Cited

U.S. PATENT DOCUMENTS

| | | | |
|---|---|---|---|
| 5,768,546 | A | 6/1998 | Kwon |
| 5,946,293 | A | 8/1999 | Beale et al. |
| 6,799,200 | B1 | 9/2004 | Blackmore et al. |
| 6,801,958 | B1 | 10/2004 | Gugel |

*Primary Examiner*—VanThu Nguyen
(74) *Attorney, Agent, or Firm*—Buckley, Maschoff & Talwalkar LLC

(57) ABSTRACT

An arrangement of buffer in a memory unit including a plurality of memory banks may store information in rows that span the memory banks. Moreover, a processor may be adapted to (i) establish a plurality of buffers to be associated with the memory unit, wherein the size of each buffer is less than the width of a memory bank, and (ii) arrange for a selected buffer to begin in a memory bank other than a memory bank in which a previously selected buffer begins.

21 Claims, 11 Drawing Sheets

US 7,158,438 B2

NETWORK PACKET BUFFER ALLOCATION OPTIMIZATION IN MEMORY BANK SYSTEMS

CROSS REFERENCE TO RELATED APPLICATION

This is a divisional of co-pending prior U.S. patent application Ser. No. 10/338,429, filed Jan. 8, 2003 now U.S. Pat. No. 6,906,980.

BACKGROUND

Information, such as information associated with data packets, can be stored in a memory unit that includes multiple interleaved memory banks. For example, FIG. 1 is a block diagram of a known network device 100 that includes a network processor 110 that can transmit and receive data packets via a communication unit 120. The network processor 110 also stores and retrieves information associated with the data packets via a memory unit 130 that includes four interleaved memory banks 132 (i.e., banks 0 through 3). The use of interleaved memory banks 132 may facilitate concurrency and bandwidth utilization in the network device 100. The memory banks 132 may be, for example, Dynamic Random Access Memory (DRAM) devices.

A memory controller 140 facilitates the exchange of information between the network processor 110 and the memory unit 130. For example, the network processor 110 might issue to the memory controller 140 a command to read a particular data packet. The memory controller 140 would in turn retrieve the appropriate information from the memory unit 130. In particular, the memory controller 140 would accesses the information via a row 134 (that spans the four memory banks 132) and a column that defines a position within that row 134.

The memory controller 140 may access the memory unit 130 in accordance with a pre-defined memory protocol. For example, FIG. 2 is a flow chart of a known method to exchange information with a memory unit 130 associated with DRAM devices. Note that a DRAM device stores each bit of information in a "cell" composed of a capacitor and a transistor. Because the capacitor in a DRAM cell can hold a charge for only a brief period of time, the DRAM device is continually refreshed in order to retain the data.

When the memory controller 140 needs to access information (i.e., to store or retrieve information), it issues a pre-charge to the memory unit at 202. This flushes out the previously active row. The memory controller 140 then issues a Row Address Strobe (RAS) to the memory unit 130 for the appropriate row at 204. The RAS initiates the memory cycle and latches the row address (i.e., the address pins are latched when the RAS is received by the memory unit 130). At 206, the memory controller 140 issues a Column Address Strobe (CAS) to the memory unit 130 for the appropriate column. The CAS latches the column address and initiates the read or write operation. At 208, the appropriate data is exchanged with the memory unit 130 (i.e., the data is stored into or read from the appropriate row and column).

If the next access to the memory unit 130 is for the same row, a CAS for the next column can simply be issued at 206 and the process continues. That is, no pre-charge or RAS needs to be issued to flush the currently active row. If, however, the next access to the memory unit 130 is for a different row, a pre-charge and RAS must be issued for the new row at 202 and 204 before the process continues.

Note that a memory controller 140 might issue a pre-charge and a RAS to a particular memory bank 132 even when the same row is being accessed. For example, the memory controller 140 might not store an indication of the last row that was accessed and/or might issue the pre-charge as soon as the network processor 110 requests access to a memory bank 132.

Because of this protocol, there is a delay-between the time information in a particular memory bank 132 is accessed and the next time the same memory bank 132 can be accessed. That is, if the network processor 110 repeatedly accesses information stored in the same memory bank 132, significant delays can be incurred (even when the information is stored in a single row).

Consider, for example, a network processor 110 that sequentially accesses a series of data packets that are sequentially stored in the memory unit 130. In this case, a particular memory bank 132 might be accessed before a prior access to that memory bank 132 is completed. As a result, the second access can experience a significant delay, and the overall performance of the network device 100 can be degraded.

DETAILED DESCRIPTION

Some embodiments described herein are associated with data "packets." As used herein, the term "packet" may refer to any set of data, such as a set of data associated with a communication protocol. By way of example, a data packet might be associated with the Fast Ethernet Local Area Network (LAN) transmission standard 802.3-2002® published by the Institute of Electrical and Electronics Engineers (IEEE).

In addition, some embodiments are associated with a "network device." As used herein, the phrase "network device" may refer to any device adapted to exchange packets of information. Examples of network devices include the INTEL® IXP2400 and IXP2800 network processors.

Moreover, some embodiments are associated with "memory units" and "memory banks." As used herein the phrases "memory unit" and "memory bank" may refer to any device adapted to store information. For example, a memory unit or memory bank may be a Double Data Rate (DDR) DRAM device that can exchange information on both the rising and falling edges of a clock signal.

Buffer Arrangement

Figure 3:
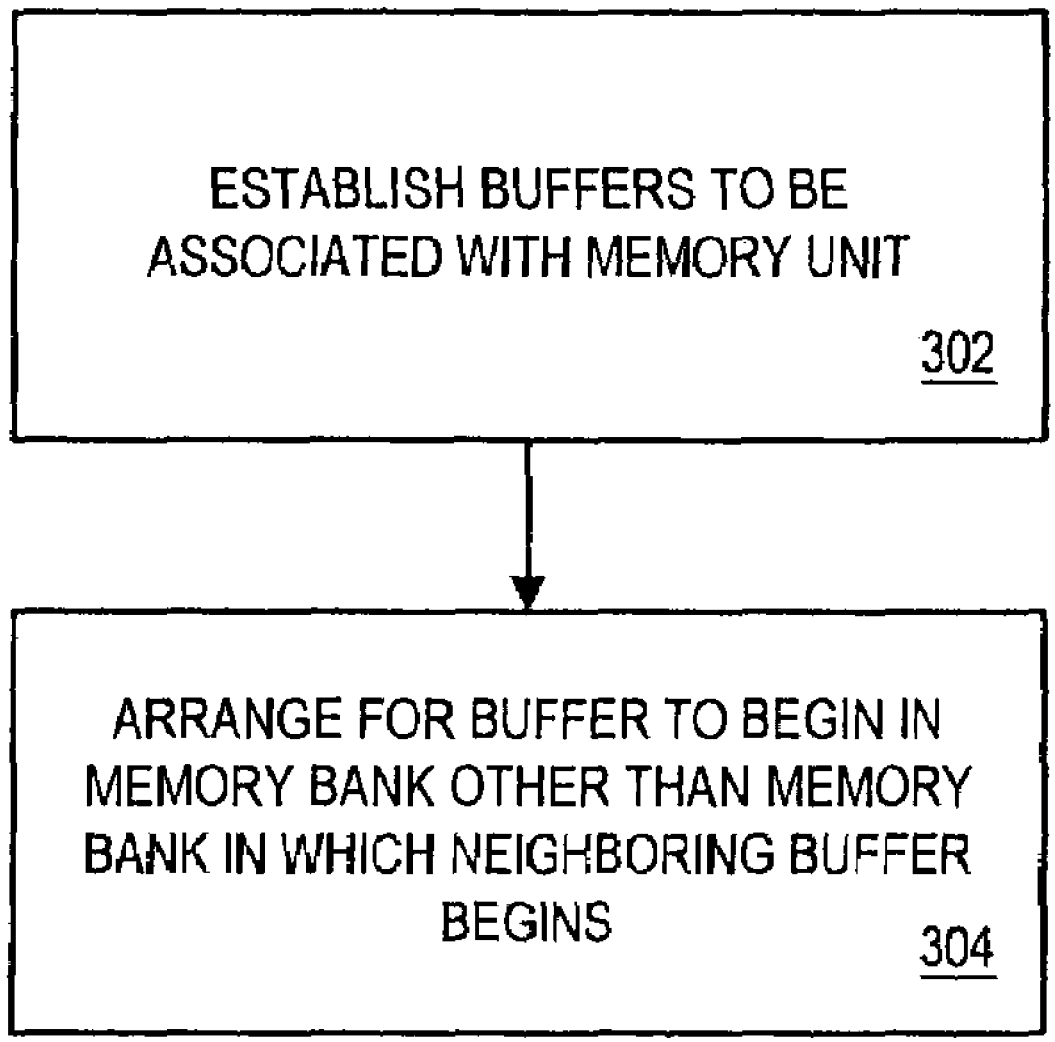
FIG. 3 is a flow chart of a method to arrange buffers in a memory unit according to some embodiments.

FIG. 3 is a flow chart of a method to arrange buffers in a memory unit according to some embodiments. The method may be performed, for example, by a network processor. The flow charts described herein do not necessarily imply a fixed order to the actions, and embodiments may be performed in any order that is practicable. Moreover, any of the methods described herein may be performed by hardware, software (including microcode), or a combination of hardware and software.

At 302, a plurality of buffers to be associated with a memory unit are established. According to this embodiment, the memory unit includes multiple memory banks to store data in rows that span the memory banks. Moreover, the size of each buffer is at least the width of the memory unit.

The buffers may be, for example, fixed-sized areas that are used to store and retrieve data packets. For example, when data packets are received they may be stored in one or more buffers before being forwarded. Note that storing data from a single packet might require more than one buffer (e.g., a number of buffers could be glued together with chaining). Moreover, each buffer may be associated with a buffer descriptor (and information associated with a buffer may be stored in the buffer descriptor).

At 304, it is arranged for a buffer to begin in a memory bank other than a memory bank in which a neighboring buffer begins. For example, an offset may be provided between the end of one buffer and the beginning of the next buffer. The offset may be associated with, for example, the width of each memory bank.

Figure 4:
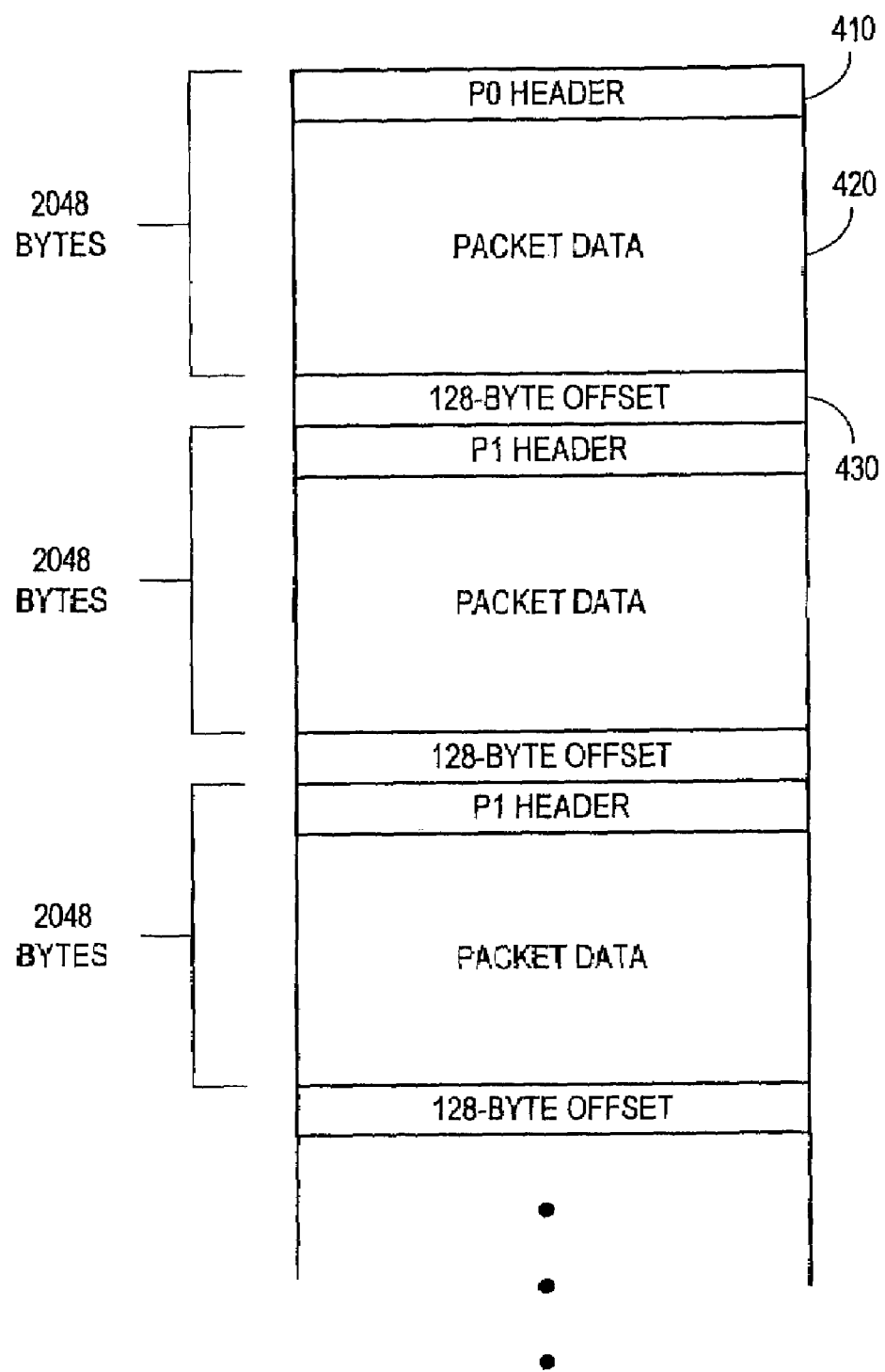
FIG. 4 illustrates buffer offsets in a memory unit according to some embodiments.

Refer now to FIG. 4, which illustrates buffer offsets in a memory unit according to some embodiments. In particular, this memory unit includes four memory banks that each have a width of 128 bytes (i.e., the width of the entire memory unit is 4×128=512 bytes). Moreover, each buffer is 2048 bytes long (and will therefore occupy at least four rows in the memory unit) and includes a 128-byte packet header 410 and 1920 bytes of associated packet data 420.

If the buffers were simply stored back-to-back in the memory unit, each buffer would begin in the first memory bank (i.e., the first buffer would begin in the first row of the first memory bank and the second buffer would begin in the fifth row of the first memory bank). Thus, accessing sequential packet headers 410 would result in the first memory bank being repeatedly accessed (causing delays between each access).

To avoid this, a 128-byte offset 420 is provided between the end of one buffer and the beginning of the next buffer. In this way, each buffer will begin in a memory bank other than a memory bank in which a neighboring buffer (e.g., the previous or subsequent buffer) begins.

Figure 5:
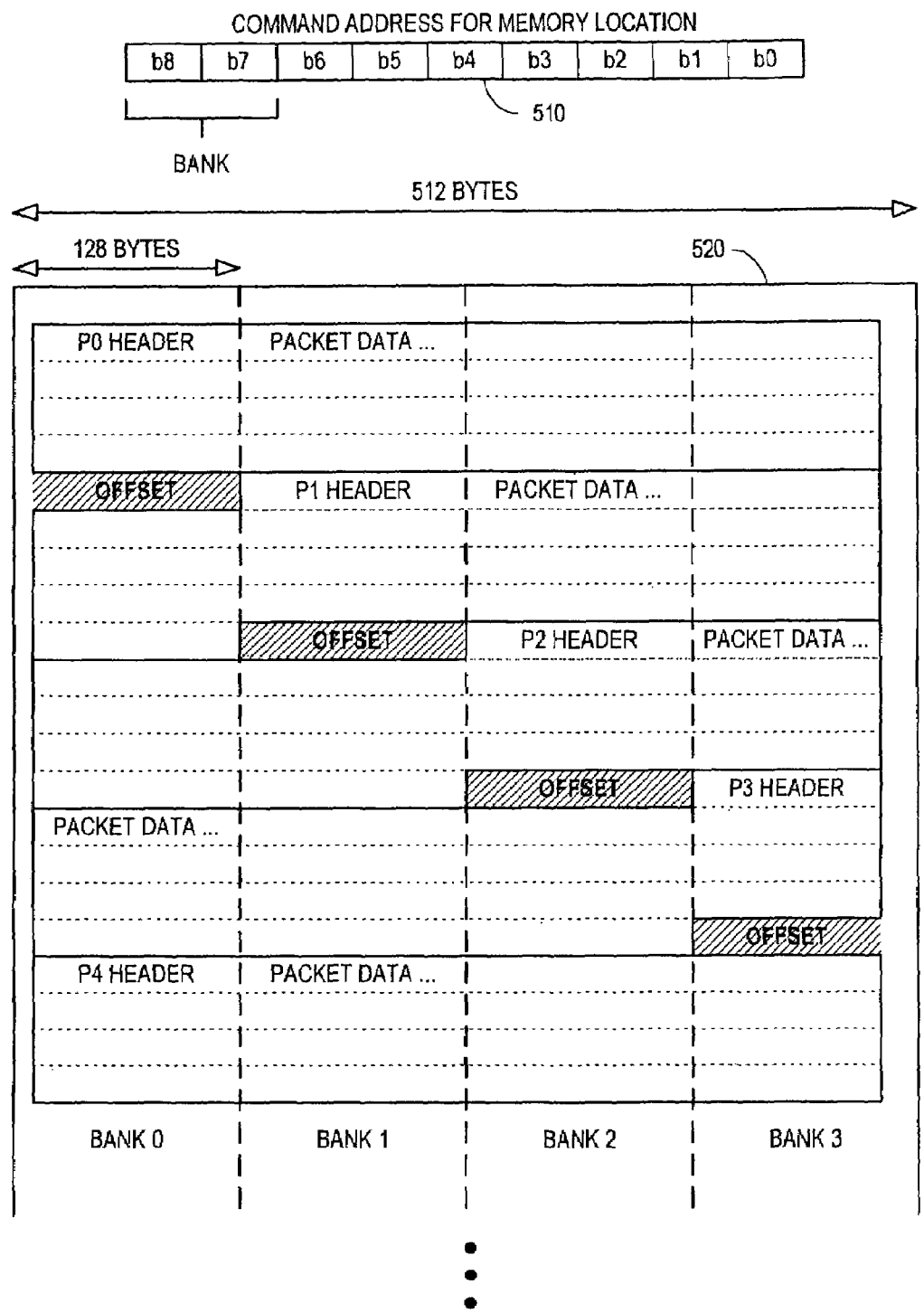
FIG. 5 illustrates buffer offsets in memory banks according to some embodiments.

Refer now to FIG. 5, which illustrates how the buffers of FIG. 4 are arranged in the four memory banks of a memory unit 520 according to some embodiments. Note that a command address for a memory location 510 in the memory unit 520 includes nine bits (i.e., b0 through b8), with b7 and b8 being used to select one of the four memory banks.

As can be seen, the first 2048-byte buffer begins in first row of the first memory bank and ends in the fourth row of the fourth memory bank. Because of the 128-byte offset after the first buffer, the second 2048-byte buffer begins in the fifth row of the second memory bank (and ends in the ninth row of the first memory bank). As a result, the packet header of the second buffer can be accessed after the packet header of the first buffer is accessed without incurring a delay (e.g., because the two packet headers are stored in different memory banks).

Note that when a memory unit has L memory banks, each having a width ($2^M$) smaller than the size of each buffer ($2^N$), a single buffer can cover $2^N/(L \times 2^M)$ rows from each of the L banks. Thus, $2^N$ is a multiple of ($L \times 2^M$). If the $p_{th}$ buffer starts at the address $p \times (2^N) + p(2^M)$, the $(p+1)_{th}$ buffer will start at the address of $(p+1) \times (2^N) + (p+1) \times (2^M)$. Since $2^N$ is a multiple of ($L \times 2^M$), the starting addresses of these two back-to-back buffers will be allocated in different banks.

Buffer Pool Arrangement

Figure 6:
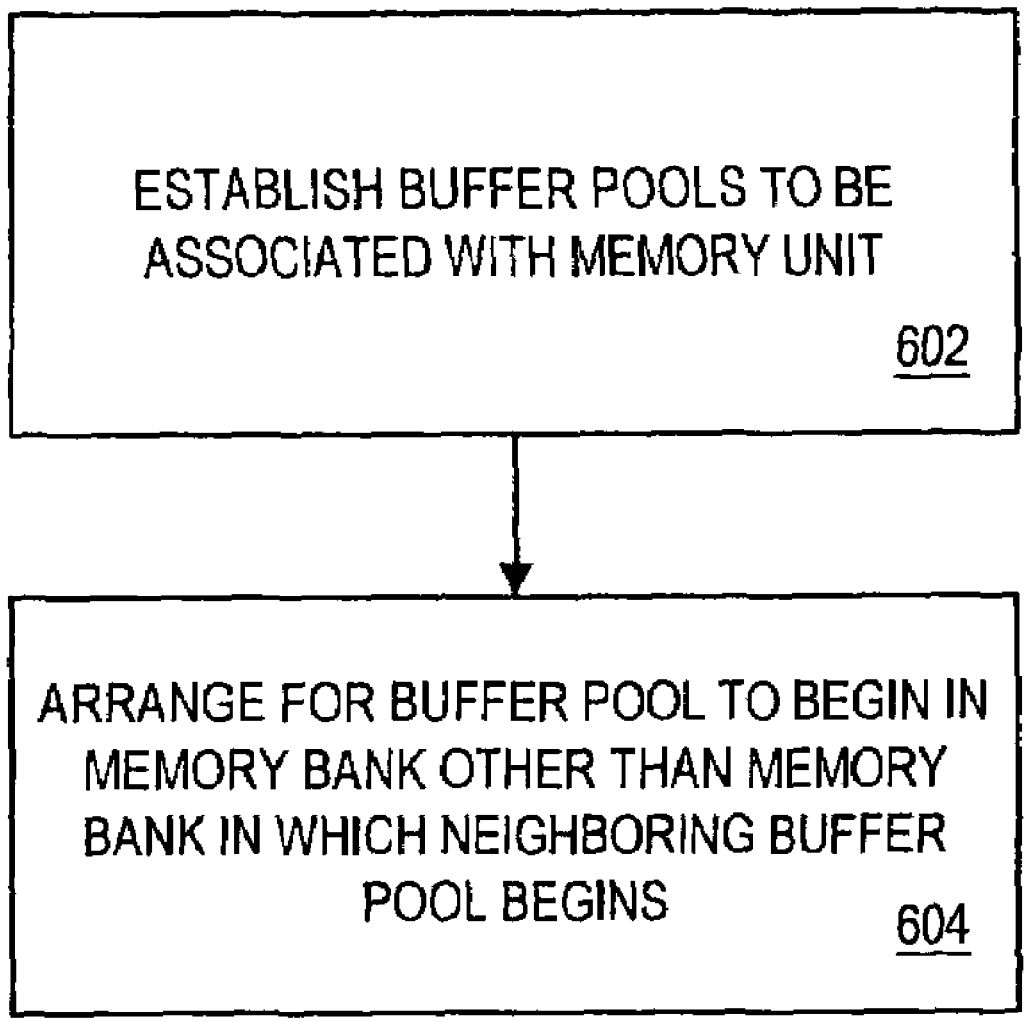
FIG. 6 is a flow chart of a method to arrange buffer pools in a memory unit according to some other embodiments.

In the embodiments described with respect to FIGS. 3 through 5, an offset is provided between each buffer in a memory unit. According to another embodiment, a plurality of fixed-size buffer pools are established (i.e., and each buffer pool can store a plurality of buffers). FIG. 6 is a flow chart of a method to arrange the buffer pools in a memory unit according to this embodiment. The method may be performed, for example, by a network processor.

At 602, a plurality of buffer pools to be associated with a memory unit are established. As before, the memory unit includes multiple memory banks to store data in rows that span the memory banks. Moreover, the size of each buffer pool is at least the width of the memory unit.

At 604, it is arranged for a buffer pool to begin in a memory bank other than a memory bank in which a neighboring buffer pool begins. For example, an offset may be provided between the end of one buffer pool and the beginning of the next buffer pool. The offset may be associated with, for example, the width of each memory bank.

Figure 7:
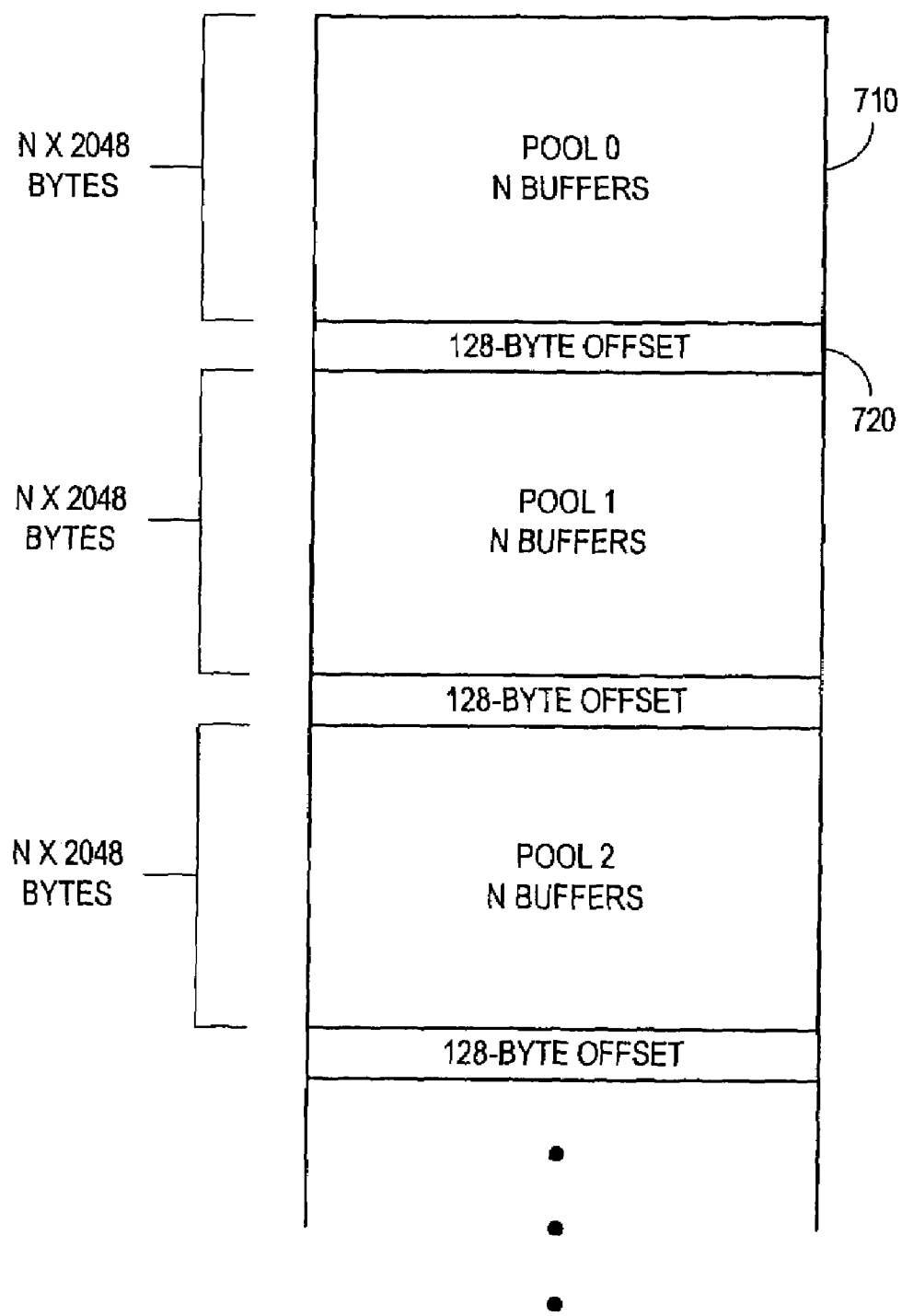
FIG. 7 illustrates buffer pool offsets in a memory unit according to some embodiments.

Refer now to FIG. 7, which illustrates buffer pool offsets in a memory unit according to some embodiments. In particular, this memory unit includes four memory banks that each have a width of 128 bytes (i.e., the width of the entire memory unit is 4×128=512 bytes). Moreover, each buffer is 2048 bytes long (and will therefore occupy at least four rows in the memory unit). Each buffer pool 710 includes N buffers (and therefore has a size of N×2048 bytes). A series of packets may be stored, for example, in sequentially selected buffer pools 710. If four buffer pools were established, for example, a series of packets might be stored in pool 0, pool 1, pool 2, pool 3, pool 0, etc. Note that when each buffer is an integer multiple of the width of the entire memory unit, every packet in a buffer pool will begin in the same memory bank (assuming the packets are stored back-to-back).

If the buffer pools 710 were simply stored back-to-back in the memory unit, each buffer pool would begin in the first memory bank. That is, the first buffer pool 710 would begin in the first row of the first memory bank and the second buffer pool 710 would begin in a subsequent row of the first memory bank (the particular row being dependant on the size of the buffer pool 710). Thus, accessing sequential packets would result in the first memory bank being repeatedly accessed (causing delays between each access).

To avoid this, a 128-byte offset 720 is provided between the end of one buffer pool 710 and the beginning of the next buffer pool 710. In this way, each buffer pool 710 will begin in a memory bank other than a memory bank in which a neighboring buffer pool 710 (e.g., the previous or subsequent buffer pool 710) begins.

Figure 8:
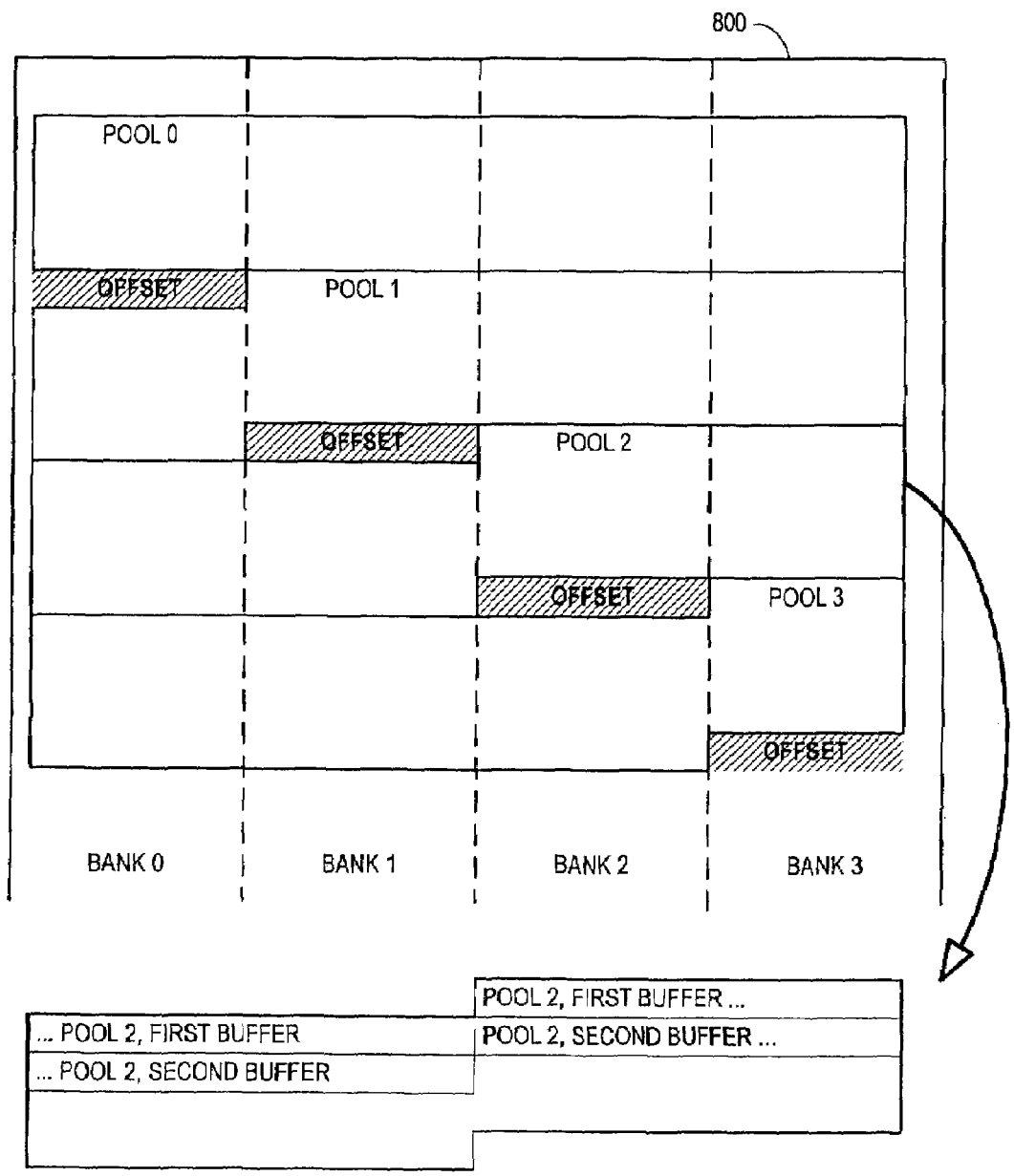
FIG. 8 illustrates buffer pool offsets in memory banks according to some embodiments.

Refer now to FIG. 8, which illustrates how the buffer pools 710 of FIG. 7 are arranged in a memory unit 800 with four memory banks according to some embodiments. As can be seen, the first buffer pool (i.e., having a size of N×2048 bytes) begins in first row of the first memory bank and ends in a subsequent row of the fourth memory bank. Because of the 128-byte offset after the first buffer pool, the second buffer pool begins in the next row of the second memory bank (and ends in a subsequent row of the first memory bank). As a result, a packet in the second buffer pool can be accessed after a packet in the first buffer pool is accessed without incurring a delay (e.g., because the two packets will begin in different memory banks).

Note that when a memory unit has L memory banks, each having a width ($2^M$) smaller than the size of each buffer ($2^N$), a single buffer can cover $2^N/(L \times 2^M)$ rows from each of the L banks. Thus, $2^N$ is a multiple of $(L \times 2^M)$. Assuming there are B buffers in each pool, the starting address of the $i_{th}$ buffer in pool p is $B \times (2^N) \times p + (2^M) \times p + I \times (2^N)$ and the starting address of the $i_{th}$ buffer in pool (p+1) is $B \times (2^N) \times (p+1) + (2^M) \times (p+1) + I \times (2^N)$. The $i_{th}$ buffer in pool p will be allocated first, followed by The $i_{th}$ buffer in pool p+1. Since $2^N$ is a multiple of $(L \times 2^M)$, the starting addresses of these two back-to-back buffers will be allocated in different banks.

Buffer Selection

Figure 9:
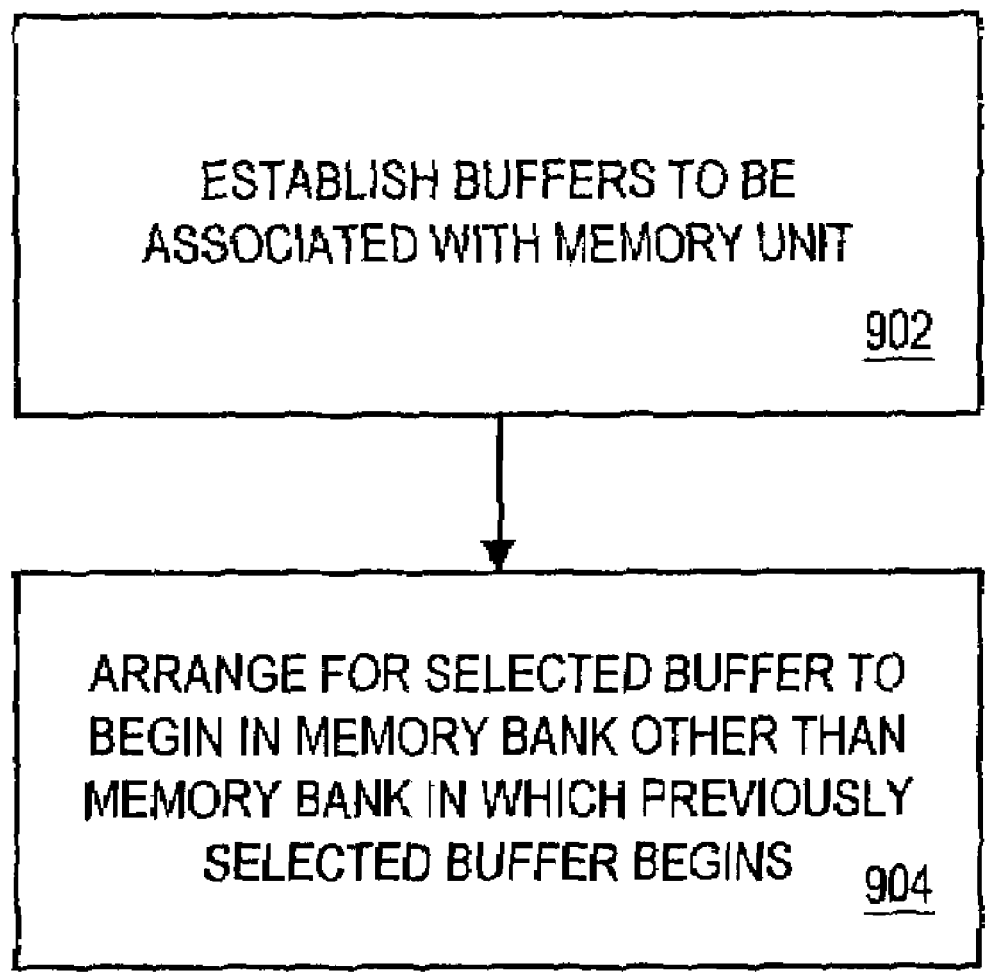
FIG. 9 is a flow chart of a method to select buffers in a memory unit according to some embodiments.

In the embodiments described with respect to FIGS. 3 through 8, buffers (or buffer pools) had a size at least the width of the entire memory unit. According to another embodiment, however, each buffer has a size less than the width of a single memory bank (e.g., a single row in one memory bank can store multiple buffers). FIG. 9 is a flow chart of a method to select buffers in a memory unit according to this embodiment.

At 902, a plurality of buffers to be associated with a memory unit are established. As before, the memory unit includes multiple memory banks to store data in rows that span the memory banks. In this case, however, the size of each buffer is less than the width of a memory bank.

Figure 10:
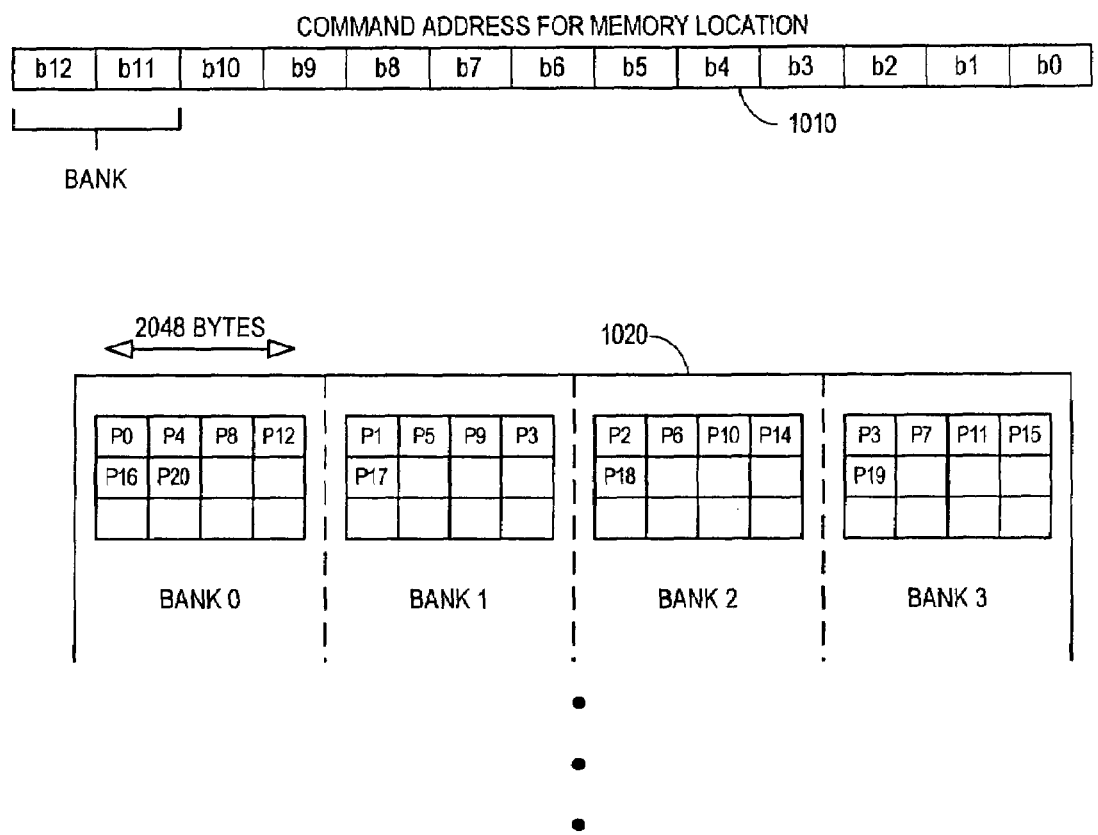
FIG. 10 illustrates buffers in memory banks according to some embodiments.

Refer now to FIG. 10, which illustrates how such buffers may be arranged in memory banks according to some embodiments. Note that a command address for a memory location 1010 in this memory unit 1020 includes thirteen bits (i.e., b0 through b12), with b11 and b12 being used to select one of the four memory banks. The width of each memory bank is 2048 bytes, and the size of each buffer is 512 bytes (i.e., four 512-byte buffers can stored in each row of each memory bank).

If the buffers were simply selected from the memory unit 1020 in a back-to-back fashion (i.e., were stored into or read from in a back-to-back fashion), the same row in the same memory bank would be repeatedly accessed (e.g., the first row in the first memory bank would be accessed four times to access the first four buffers).

To avoid this (referring again to FIG. 9), it is arranged at 904 for a selected buffer to begin in a memory bank other than a memory bank in which a previously selected buffer begins. For example, buffers are selected from each memory bank in a sequential fashion in FIG. 10 (i.e., P0 from bank 0, P1 from bank 1, P2 from bank 2, P3 from bank 3, and P4 from bank 0).

Figure 11:
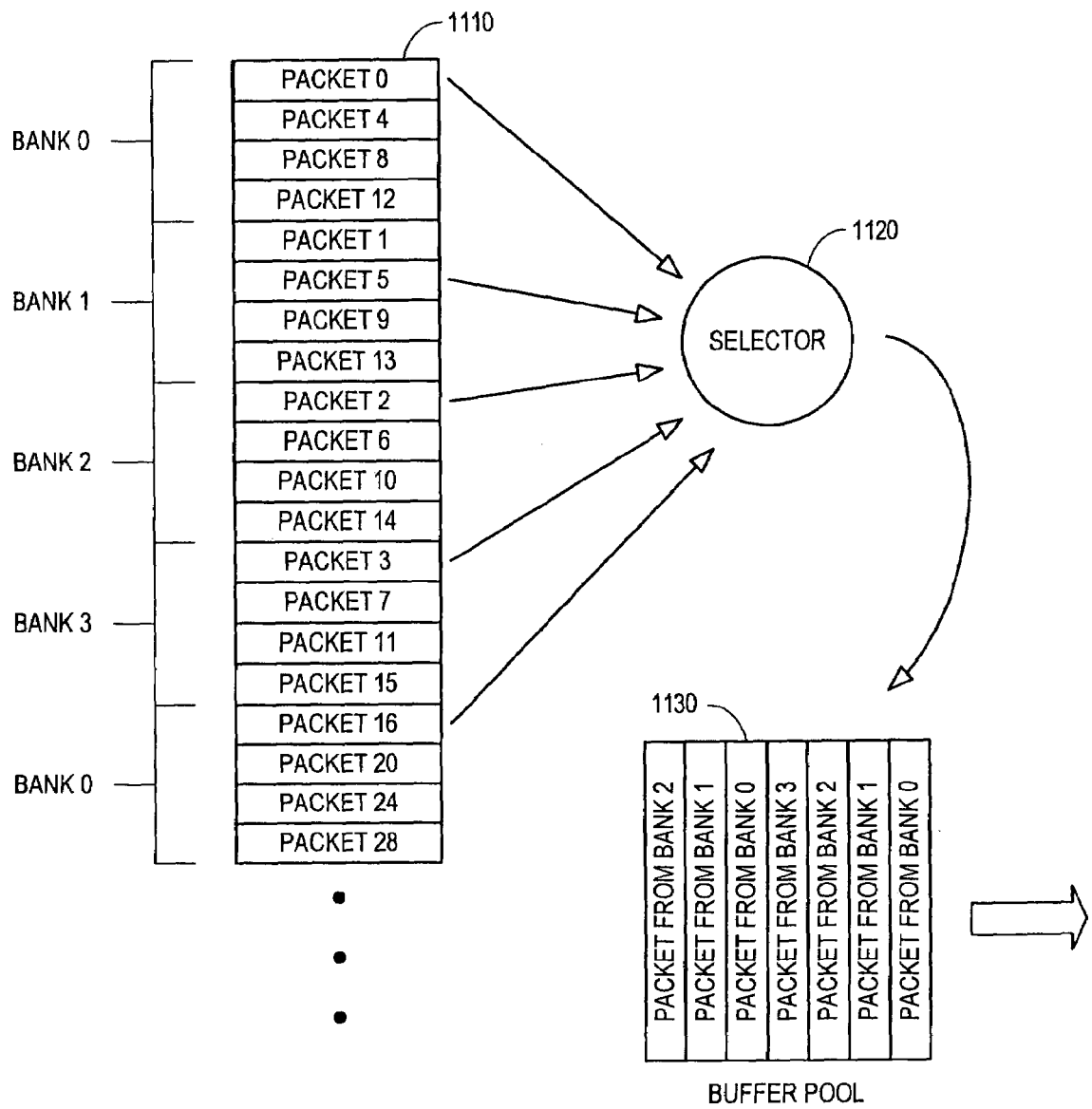
FIG. 11 illustrates buffer selection from a memory unit according to some embodiments.

FIG. 11 illustrates buffer selection from a memory unit 1110 according to some embodiments. In particular, a selector 1120 selects positions from the memory unit 1110 to create a buffer pool 1130 (e.g., a buffer indication may be placed in the buffer pool). Buffers can then be selected in accordance with location in the buffer pool. The selector 1120 may select positions, for example, in a pre-determined sequence (e.g., sequentially). According to another embodiment, positions are instead selected in a random sequence (e.g., a random or pseudo-random pattern have a substantially uniform distribution among the memory banks).

Note that when a memory unit has L memory banks, each having a width ($2^M$) larger than the size of each buffer ($2^N$), a single row in a single memory bank can hold $2^{M-N}$ buffers. Thus, the first group of $2^{M-N}$ buffers fall into the first memory bank and the remaining $(L-1) \times 2^{M-N}$ buffers fall into the remaining L−1 memory banks. Similarly, the next group of $2^{M-N}$ buffers again fall into the first memory bank (on the next row). When initializing the buffer pool, one buffer from each bank may be sequentially inserted into the list. The resulting list will comprise L buffers in a row across L different memory banks. As a result, the first buffers of back-to-pack packets may be allocated to different memory banks.

Network Device

Figure 1:
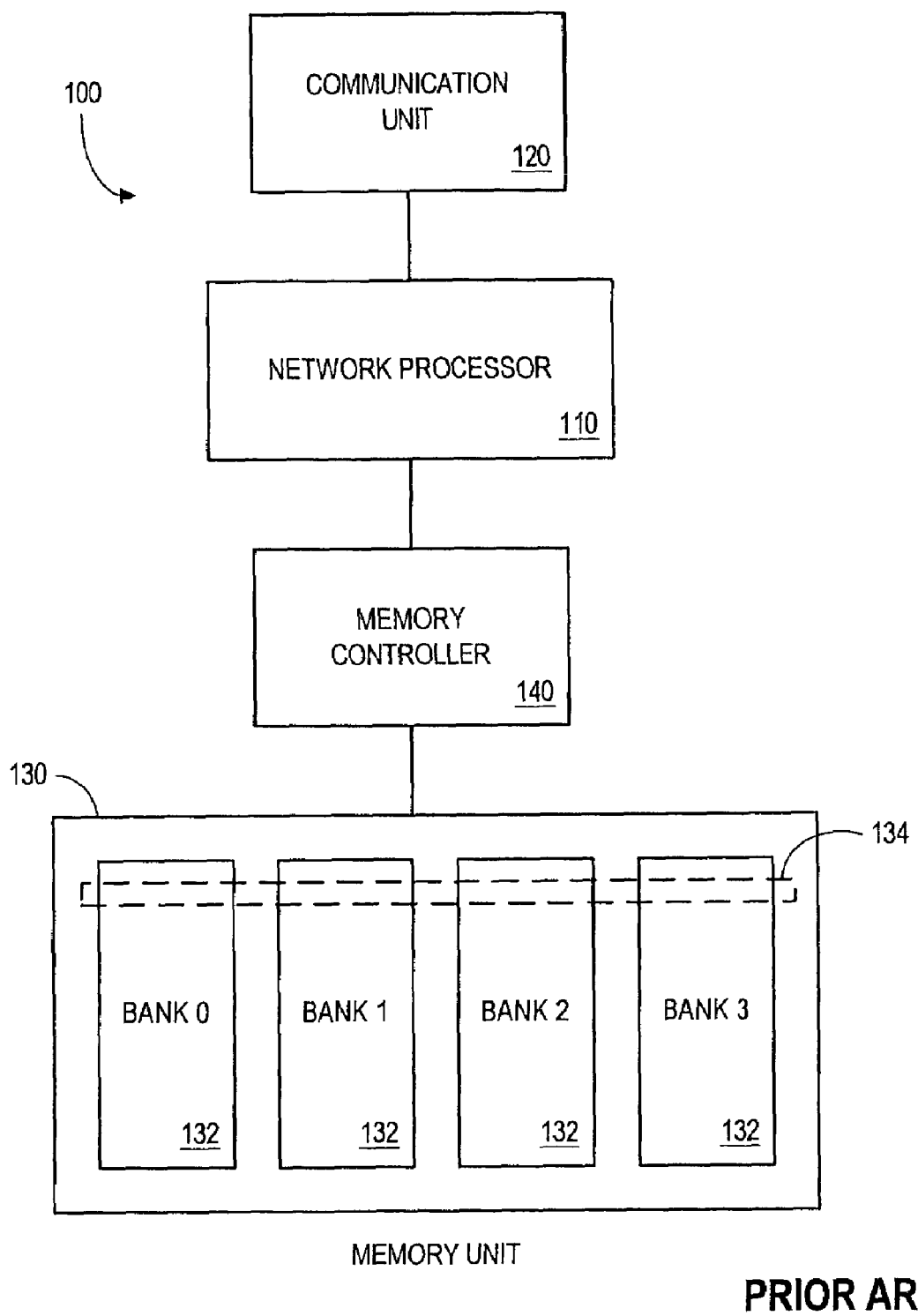
FIG. 1 is an illustration of a known network device including a network processor.
Figure 2:
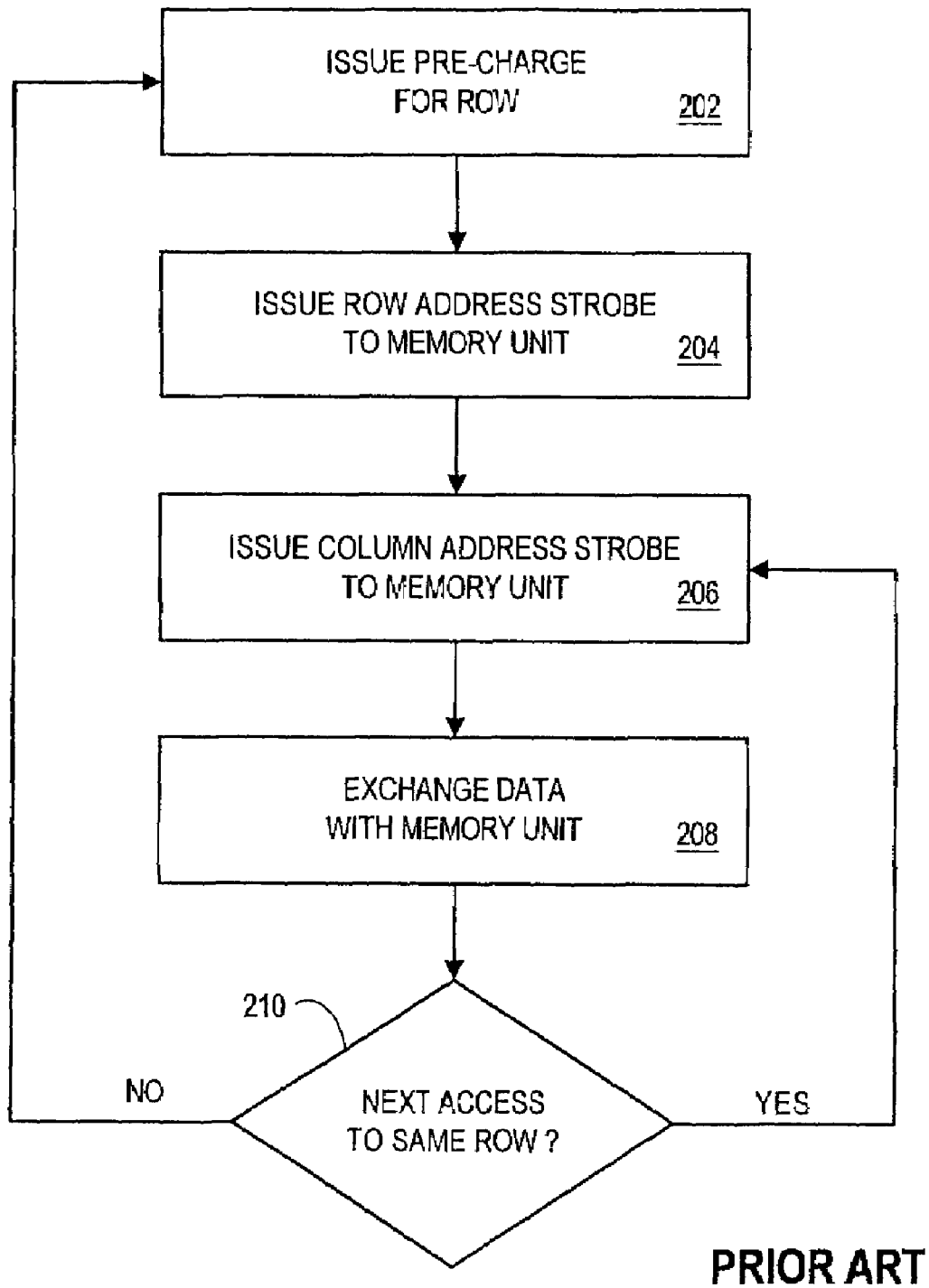
FIG. 2 is a flow chart of a known method to exchange information with a DRAM device.

Note that any of the embodiments described herein with respect to FIGS. 3 through 11 may be associated with a network device similar to the one described with respect to FIG. 1. For example, a network processor may transmit and receive data packets via a communication unit. The network processor may also store and retrieve information associated with the data packets via a memory unit that includes multiple interleaved DDR DRAM memory banks. A memory controller may facilitate the exchange of information between the network processor and the memory unit (e.g., by issuing an appropriate row pre-charge, RAS, and CAS).

According to some embodiments, the network processor may arrange for a packet buffer area (e.g., a buffer or a buffer pool) to begin in a memory bank other than a memory bank in which a neighboring packet buffer area begins. For example, an offset may be provided between the end of one packet buffer area and the beginning of the next packet buffer area. According to other embodiments, packets may be selected such that a selected packet will begin in a memory bank other than the memory bank in which a previously selected packet began (e.g., via a buffer pool).

As a result, sequential packets may be accessed without incurring a significant delay, and the overall performance of the network device may be improved.

Additional Embodiments

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, although some embodiments have been described herein with respect to memory units having four memory banks, embodiments may be practiced with any number of multiple memory banks. Moreover, although memory bank widths and buffer sizes have been used as examples, embodiments may be practiced with any memory bank width and buffer size. Similarly, although certain offset sizes and buffer arrangements have been illustrated, other offset sizes and buffer arrangements may be used instead.

The several embodiments described herein are solely for the purpose of illustration. Persons skilled in the art will recognize from this description other embodiments may be practiced with modifications and alterations limited only by the claims.

What is claimed is:

1. An apparatus, comprising:
   a memory unit including a plurality of memory banks to store information in rows that span the memory banks; and
   a processor adapted to (i) establish a series of buffers to be stored in the rows of the memory unit, wherein the size of each buffer is less than the width of a memory bank, and (ii) arrange for a selected buffer to begin in a memory bank other than a memory bank in which a previously selected buffer begins.

2. The apparatus of claim 1, wherein the processor is to select buffers from memory banks in at least one of: (i) a pre-determined sequence, or (ii) a random sequence.

3. The apparatus of claim 1, wherein the processor is to place a buffer indication in a buffer pool and select buffers in accordance with location in the buffer pool.

4. The apparatus of claim 1, wherein each buffer is to store packet data and the processor comprises a network processor.

5. The apparatus of claim 1, wherein the memory unit comprises a double data rate dynamic random access memory unit.

6. The apparatus of claim 1, wherein the selected buffer is associated with a command address including a memory bank indication portion.

7. The apparatus of claim 6, wherein the memory bank indication portion includes memory bank bits to uniformly spread buffer selection among the memory banks.

8. A method, comprising:
   establishing a series of buffers to be associated with a memory unit, the memory unit including a plurality of memory banks to store the series of buffers in rows that span the memory banks, wherein the size of each buffer is less than the width of a memory bank; and
   arranging for a selected buffer to begin in a memory bank other than a memory bank in which a previously selected buffer begins.

9. The method of claim 8, wherein said arranging comprises:
   selecting buffers from memory banks in at least one of: (i) a pre-determined sequence, and or (ii) a random sequence.

10. The method of claim 8, wherein said arranging comprises:
    placing a buffer indication in a buffer pool; and
    selecting buffers in accordance with location in the buffer pool.

11. The method of claim 8, wherein each buffer is to store packet data and said arranging is performed by a network processor.

12. The method of claim 8, wherein the memory unit comprises a double data rate dynamic random access memory unit.

13. The method of claim 8, wherein the selected buffer is associated with a command address including a memory bank indication portion.

14. The method of claim 13, wherein the memory bank indication portion includes memory bank bits to uniformly spread buffer selection among the memory banks.

15. A medium storing instructions adapted to be executed by a processor to perform a method, said method comprising:
    establishing a series of buffers to be associated with a memory unit, the memory unit including a plurality of memory banks to store the series of buffers in rows that span the memory banks, wherein the size of each buffer is less than the width of a memory bank; and
    arranging for a selected buffer to begin in a memory bank other than a memory bank in which a previously selected buffer begins.

16. The medium of claim 15, wherein said arranging comprises:
    selecting buffers from memory banks in at least one of: (i) a pre-determined sequence, or (ii) a random sequence.

17. The medium of claim 15, wherein said arranging comprises:
    placing a buffer indication in a buffer pool; and
    selecting buffers in accordance with location in the buffer pool.

18. The medium of claim 15, wherein each buffer is to store packet data and the processor is a network processor.

19. The medium of claim 15, wherein the memory unit comprises a double data rate dynamic random access memory unit.

20. The medium of claim 15, wherein the selected buffer is associated with a command address including a memory bank indication portion.

21. The medium of claim 20, wherein the memory bank indication portion includes memory bank bits to uniformly spread buffer selection among the memory banks.

* * * * *